(12) United States Patent
Cheng et al.

(10) Patent No.: US 6,630,380 B1
(45) Date of Patent: Oct. 7, 2003

(54) METHOD FOR MAKING THREE-DIMENSIONAL METAL-INSULATOR-METAL CAPACITORS FOR DYNAMIC RANDOM ACCESS MEMORY (DRAM) AND FERROELECTRIC RANDOM ACCESS MEMORY (FERAM)

(75) Inventors: Wei-Hua Cheng, Singapore (SG); Daniel Yen, Singapore (SG); Kunihiko Takahashi, Singapore (SG); Ming Lei, Singapore (SG); Thomas Joy, Singapore (SG)

(73) Assignee: Chartered Semiconductor Manufacturing Ltd, Singapore (SG)

( * ) Notice: Subject to any disclaimer, the term of this patent is extended or adjusted under 35 U.S.C. 154(b) by 0 days.

(21) Appl. No.: 10/261,303

(22) Filed: Sep. 30, 2002

(51) Int. Cl.[7] .......................................... H01L 21/8242
(52) U.S. Cl. ...................... 438/253; 438/397; 438/598; 438/638
(58) Field of Search ................... 438/253, 399, 438/396, 598, 620, 128, 130, 631, 634, 638, 243, 386, 957, 397, FOR 209–355, FOR 430

(56) References Cited

U.S. PATENT DOCUMENTS

| | | | |
|---|---|---|---|
| 5,192,703 A | * 3/1993 | Lee et al. ................... | 438/396 |
| 5,447,882 A | 9/1995 | Kim ........................... | 437/60 |
| 5,702,989 A | 12/1997 | Wang et al. ................. | 438/397 |
| 6,080,621 A | 6/2000 | Wang et al. ................. | 438/253 |
| 6,251,726 B1 | 6/2001 | Huang ........................ | 438/253 |
| 6,258,662 B1 | 7/2001 | Wang et al. ................. | 438/253 |
| 6,265,262 B1 | 7/2001 | Okuno et al. ............... | 438/253 |

\* cited by examiner

*Primary Examiner*—George Fourson
*Assistant Examiner*—Thanh Pham
(74) *Attorney, Agent, or Firm*—George O. Saile; Rosemary L. S. Pike

(57) ABSTRACT

A method for making metal-insulator-metal (MIM) capacitors having insulators with high-dielectric-constant or ferroelectric interelectrode films compatible with the dual-damascene process is achieved. The method of integrating the MIM with a dual-damascene process is to form a planar a first insulating layer and to deposit an etch-stop layer and a second insulating layer. Capacitor node contact openings are etched to the substrate and first recesses are etched to the etch-stop layer. The contact openings and first recesses are filled with a conducting layer using a dual-damascene process. Second recesses are formed in the second insulating layer around the capacitor node contacts. A conformal first metal layer, an interelectrode dielectric layer, and a second metal layer are deposited, and are patterned at the same time to form the capacitors over the node contacts. The second recesses increase the capacitor area while the simultaneous patterning of the metal layers results in fewer processing steps.

28 Claims, 1 Drawing Sheet

US 6,630,380 B1

METHOD FOR MAKING THREE-DIMENSIONAL METAL-INSULATOR-METAL CAPACITORS FOR DYNAMIC RANDOM ACCESS MEMORY (DRAM) AND FERROELECTRIC RANDOM ACCESS MEMORY (FERAM)

BACKGROUND OF THE INVENTION (1) Field of the Invention

The present invention relates to a method for making multilayer metal-insulator-metal capacitors for ultra-large-scale integration (ULSI), and more particularly relates to a method for making three-dimensional capacitors with increased capacitance per unit area. This method reduces the surface topography and layout area making it easier to pattern the capacitor top and bottom electrodes which are patterned at the same time using ion milling or plasma etching.

(2) Description of the Prior Art

High density arrays of memory cells are used to store binary information (zeros and ones). Typically for DRAM or FeRAM, each memory cell consists of a single field effect transistor (FET) and a stacked capacitor extending in a vertical direction to increase the capacitance as the cell area on the substrate decreases. To further increase the capacitance, it is desirable to use a high-dielectric film as the capacitor interelectrode material. To form non-volatile memory, a ferroelectric material can be used as the interelectrode film. In early versions of stacked capacitors, a patterned conductively doped polysilicon layer was used to make the capacitor electrodes, which was also used to form the field effect transistor (FET) gate electrodes and/or bipolar transistor emitter and/or base contacts. In recent years it is typical to form stacked capacitors using low resistance multilevels of metal (e.g., metal silicide, Al/Cu, TiN, etc.). These metal layers can also be patterned to form the low resistance electrical interconnections for the individual semiconductor devices to increase circuit performance (switching speed).

Numerous methods of making stacked capacitors have been reported in the literature. Most of these patents increase the capacitance by increasing the capacitor area and/or by increasing the dielectric constant of the interelectrode film. For example, in U.S. Pat. No. 6,265,262 B1 to Okuno et al., a method is described for making a silicon plug for a stacked capacitor using a metal silicide to reduce the plug electrical resistance. A barrier layer is incorporated to prevent the capacitor polysilicon bottom electrode from diffusing into the metal silicide in the plug. In U.S. Pat. No. 6,258,662 B1 to Wang et al., a method is described for forming cylindrical DRAM capacitors by depositing a conformal polysilicon layer over recesses in an insulating layer. The capacitor contact plugs to the substrate are in recesses. Another insulating layer is deposited to fill the recesses and is etched back to form the cylindrical capacitor bottom electrodes, as shown in FIG. 2G. A wet etch is used to remove the remaining insulating layer leaving freestanding polysilicon bottom electrodes, as shown in FIG. 2H. In U.S. Pat. No. 6,251,726 B1 to Huang, a method is described for forming stacked capacitors having an additional polysilicon plug for increased capacitance. In U.S. Pat. No. 5,702,989 to Wang et al., a method is described for making a tub-shaped stacked capacitor having a central column for increased capacitance. In U.S. Pat. No. 5,447,882 to Kim, a method is described for forming capacitors over contact plugs in recesses to the substrate. U.S. Pat. No. 6,080,621 to Wang et al. described a method for forming DRAMs using self-aligning methods to increase cell density. And in U.S. Pat. No. 5,192,703 to Lee et al. a method and structure are described using a tungsten contact core for a stacked capacitor. In a second embodiment a fin-like structure is formed on the tungsten core to increase capacitance without increasing the lateral dimension of the capacitor.

There is still a need in the semiconductor industry to form high-capacitance metal capacitors with high-k dielectric interelectrode films for memory devices using a simple process that is manufacturing cost-effective.

SUMMARY OF THE INVENTION

A principal object of the present invention is to provide a novel stacked metal-insulator-metal capacitor comprised for memory circuits having a high-k dielectric or ferroelectric film for the interelectrode insulator.

A second object of this invention is to provide a method for making these capacitors that is a simple cost-effective manufacturing process.

A third object of this invention is to achieve this simple cost-effective manufacturing process, which provides increased capacitor area with minimum memory cell layout area, while providing a more reliable plasma etch or ion milling step for patterning the metal-insulator-metal capacitor.

A fourth object is to integrate a DRAM or FeRAM capacitor with a dual damascene local interconnection structure.

The objects of this invention are achieved by first providing a semiconductor substrate (wafer) having semiconductor device areas. Typically the device areas are surrounded by shallow trench isolation to provide electrical isolation for each of the memory cell areas. A semiconductor device, such a field effect transistor (FET), is formed in each of the device areas (memory cells) on the substrate surface. Each FET consists of a thin gate oxide layer on which is formed gate electrodes patterned from a polysilicon or silicide layer. Lightly doped drain areas are formed in the substrate adjacent to the gate electrodes using ion implantation. The gate electrodes also serve as a self-aligning mask for implanting the lightly doped drains. Insulating sidewall spacers are formed on the sidewalls of the gate electrodes by depositing a conformal chemical-vapor-deposited (CVD) oxide and anisotropically etching back to the substrate. Next, source/drain areas are formed in the substrate adjacent to, and self-aligned to the sidewall spacers using a second ion implantation to complete the FETs.

Relating now more specifically to the method of this invention, a first insulating layer is deposited and planarized on the substrate to electrically insulate the underlying FETs. Next, an etch-stop layer and a second insulating layer are deposited sequentially on the planar first insulating layer. Contact openings are etched in the second insulating layer, the etch-stop layer, and the first insulating layer to one of the two source/drain areas of each of the FETs to provide node contacts for the metal-insulator-metal (MIM) capacitors. First recesses are etched in the second insulating layer to the etch-stop layer for local electrical interconnections. A conducting layer is deposited to fill the first recesses and the contact openings. The conducting layer is polished back to form the local interconnections in the first recesses and conducting plugs in the contact openings for the capacitors. The conducting layer can be a doped polysilicon, a metal silicide, or a metal. The preferred conducting material for this invention is a multilayer that includes a thin barrier layer, such as titanium nitride (TiN) or tantalum nitride (TaN), and a tungsten metal layer. The conducting layer and barrier layer are chemically-mechanically polished back to the second insulating layer; the metal deposition and polish-back is a process commonly referred to as the dual-damascene process. Next, a multitude of second recesses are etched in the second insulating layer to the etch-stop layer around each of the conducting plugs for the DRAM capacitor node contacts. A first metal layer, a thin interelectrode insulating film, and a second metal layer are conformally deposited sequentially over the substrate and in the second recesses. The first and second metal layers are preferably AlCu, TiN, or the like, and the interelectrode dielectric material has a high dielectric constant, such as tantalum pentoxide ($TaO_5$). For non-volatile memory a ferroelectric material, such as barium strontium titanium oxide (($Ba_xSr_{1-x}$)$TiO_3$) or lead-zirconium-titanium oxide (($PbZr_xTi_{1-x}$)$O_3$), and the like can be used for the interelectrode insulating film. A key feature of the invention is to use anisotropic plasma etching to pattern the first metal layer, the interelectrode insulating film, and the second metal layer at the same time to form capacitors over and contacting the conducting plugs for the node contacts. Another key feature of the invention is to pattern the capacitors only over the top planar surface of the second insulating layer. This feature prevents problems associated with residual metals remaining when directional plasma etching over non-planar surfaces, such as in the recesses. After completing the DRAM capacitors, conventional semiconductor processing can be used to complete the integrated circuit chip.

BRIEF DESCRIPTION OF THE DRAWINGS

The objects and other advantages of this invention are best understood with reference to the preferred embodiment when read in conjunction with the following drawings.

DESCRIPTION OF THE PREFERRED EMBODIMENT

Now in keeping with the objects of the invention a method for making novel metal-insulator-metal (MIM) capacitors is described in detail. These MIM capacitors use a high-dielectric constant (high-k) material for high capacitance or use a ferroelectric material for nonvolatile ferroelectric memory (FeRAM) that is integratable with a dual-damascene process. These MIM capacitors can be used with FET structures that are currently utilized in the manufacture of DRAMs. Therefore only those details of the underlying substrate structure that are necessary for understanding the present invention are described.

Figure 1:
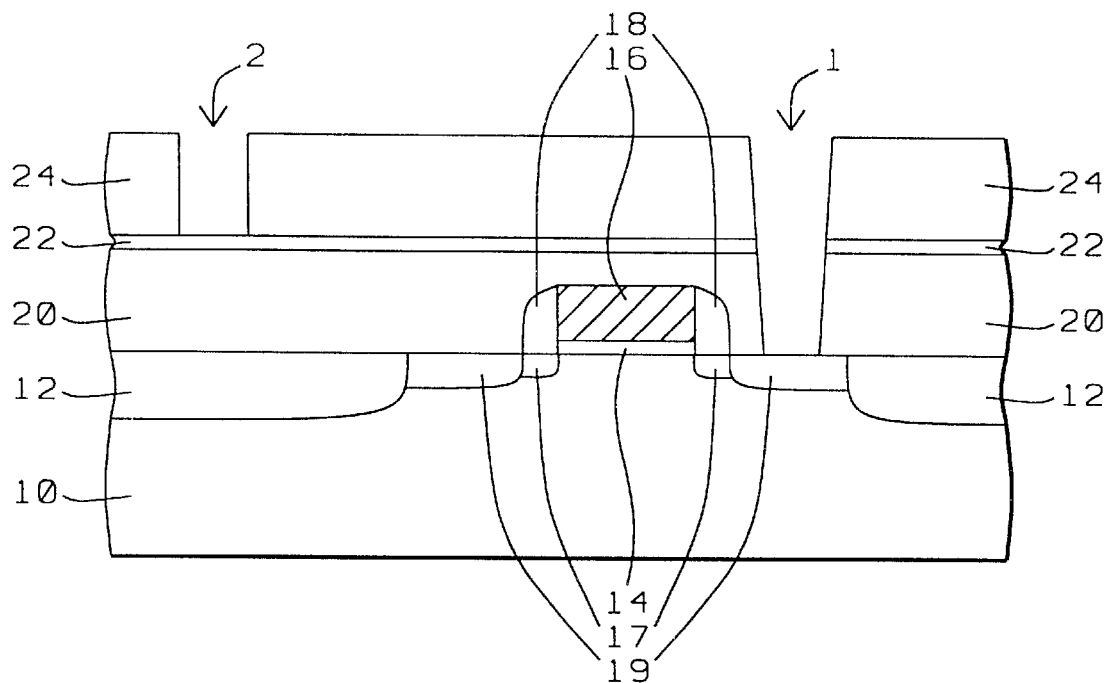
FIGS. 1 and 2 show schematic cross-sectional views through a portion of a DRAM device depicting the sequence of process step for making this novel MIM capacitor compatible with a dual-damascene process.

Referring to FIG. 1, a schematic cross-sectional view is shown of a portion of a semiconductor substrate 10 having a partially completed memory cell. The most commonly used substrate is a semiconductor material, such as a P doped (using boron) single-crystal silicon having a <100> crystallographic orientation. The method is also applicable to other substrates such as gallium arsenide (GaAs), germanium (Ge), and the like. However, the method is described for a silicon substrate. Typically the memory cell areas are surrounded by shallow trench isolation (STI) 12 to provide electrical isolation for each of the memory cell areas. The STI is formed by using photolithographic techniques and a plasma (dry) etch to form shallow trenches. The trenches are then filled with an insulating material such as $SiO_2$ which is made planar with the substrate surface, for example by mechanical-chemical polishing or by using etchback techniques. Next a semiconductor device is formed in each of the cell areas. The device most commonly formed is a field effect transistor (FET). These FETs are formed by first growing a thin gate oxide 14 (10 to 100 Angstroms) on the P doped silicon substrate 10. An N doped polysilicon layer 16 is deposited and patterned to form the gate electrodes 16. The polysilicon is deposited using low-pressure chemical-vapor deposition (LPCVD) and is N-doped using arsenic (As) or phosphorus (P). The gate electrodes are between about 1000 and 5000 Angstroms in thickness. Lightly Doped source/drain areas 17 (LDD) are formed in the substrate 10 adjacent to the gate electrodes 16 by ion implantation. For N-channel FETs the implant dopant is an N-type, such as arsenic or phosphorus. The gate electrodes 16 serve as a mask to self-align the implanted ions to the gate electrodes. Insulating sidewall spacers 18 are formed on the sidewalls of the gate electrodes 16 by depositing a conformal CVD oxide and anisotropically etching back to the substrate 10. Next the FETs are completed by forming diffused source/drain areas 19 in the substrate 10 adjacent to, and self-aligned to the sidewall spacers 18 by ion implanting an N type dopant at a higher concentration to provide ohmic contacts for the FETs.

Still referring to FIG. 1, and relating more specifically to the method of this invention, a first insulating layer 20 is deposited. Layer 20 is preferably a silicon oxide and is deposited by LPCVD or PECVD using, for example, tetra-ethosiloxane (TEOS) as the reactant gas. The oxide layer 20 is then chemically-mechanically polished back to provide a layer 20 having a planar surface that is between about 500 and 10000 Angstroms thick over the top of the FET gate electrodes 16. Next, an etch-stop layer 22 and a second insulating layer 24 are deposited sequentially on the planar first insulating layer 20. The etch-stop layer 22 is preferably silicon nitride ($Si_3N_4$) and is deposited by LPCVD using silane ($SiH_4$) and ammonia (NH3) as the reactant gases. Layer 22 is deposited to a thickness of between about 50 and 2000 Angstroms. The second insulating 24 is composed of a silicon oxide and is deposited similar to the first insulating layer 20 by LPCVD or PECVD. The thickness of layer 24 is selected depending on the desired capacitance for the DRAM capacitor, as will become clear shortly, but in general layer 24 is between about 500 and 10000 Angstroms thick.

Continuing with FIG. 1, contact openings 1 are etched in the second insulating layer 24, the etch-stop layer 22, and the first insulating 20 to one of the two sources/drain areas 19 of each of the FETs to provide node contacts for the MIM capacitors. The contact openings 1 are etched using conventional photolithographic techniques and a directional plasma etch. Next, using another photoresist mask and directional plasma etching, first recesses 2 are etched in the second insulating layer 24 to the etch-stop layer 22 for local electrical interconnections.

Figure 2:
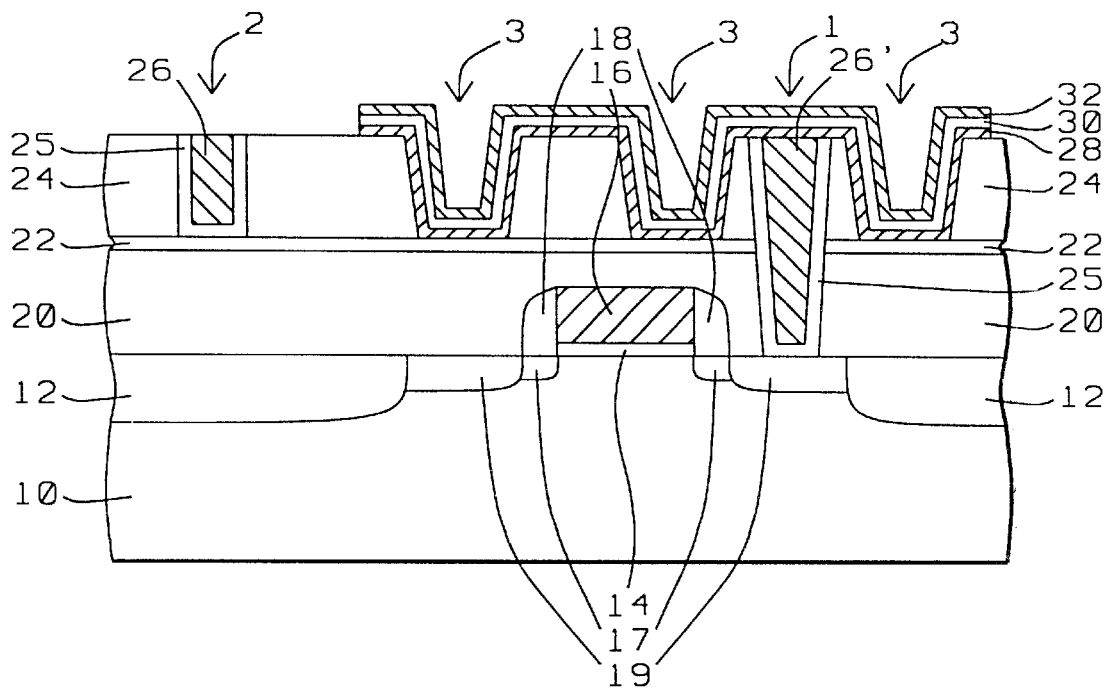

Referring to FIG. 2, a conformal thin barrier layer 25, such as TiN or TaN, is deposited. Typically layer 25 is between about 20 and 1000 Angstroms thick and is deposited by physical vapor deposition (PVD) or CVD. Next, an electrically conducting layer 26 is deposited sufficiently thick to fill the first recesses 2 and the contact openings 1. The electrically conducting layer 26 is preferably tungsten (W), but other higher conducting materials, such as aluminum, copper, and the like, can also be used. The W layer 26 is preferably deposited by CVD using, for example, tungsten hexafluoride as the reactant gas. The W layer 26 and the barrier layer 25 are then polished back to the second insulating layer 24 using commercially available CMP equipment to form the electrically conducting lines 26 in the first recesses 2, and concurrently to form the capacitor node contact plugs 26' in the contact openings 1, as shown in FIG. 2. The polish-back is commonly referred to as the dual-damascene process.

Still referring to FIG. 2, the MIM capacitors are formed next. A multitude of second recesses 3 are etched in the second insulating layer 24 to the etch-stop layer 22 around each of the conducting plugs 26' to increase the capacitor area. The number of recesses and the thickness of layer 24 are used to increase the MIM capacitor area while reducing the layout area. Continuing, a first metal layer 28, a thin interelectrode insulating film 30, and a second metal layer 32 are deposited sequentially on the substrate and conformally in the second recesses 3. The first and second metal layers 28 and 32 are preferably AlCu alloy, and are deposited by PVD to a preferred thickness of between about 2000 and 15000 Angstroms. Alternatively, other electrically conducting layers can be used, such as TiN, Ta, TaN, and the like. The interelectrode dielectric film 30 can be a high-dielectric-constant material, such as tantalum pentoxide ($TaO_5$). For non-volatile memory a ferroelectric material, such as lead-zirconium-titanium oxide (($PbZr_xTi_{1-x})O_3$) or barium strontium titanium oxide (($Ba_xSr_{1-x})TiO_3$) and the like can be used. When layer 30 is composed of a high-k material, the layer can be deposited by CVD or PVD and is formed to a thickness of between about 20 and 1000 Angstroms. When layer 30 is a ferroelectric material, such as (($PbZr_xTi_{1-x})O_3$), the layer is formed by CVD or PVD to a preferred thickness of between about 20 and 1000 Angstroms.

Continuing with FIG. 2, and a key feature of the invention is to pattern the first metal layer 28, the interelectrode insulating film 30, and the second metal layer 32 at the same time to form capacitors over and contacting the metal plugs 26' for the node contacts. Layers 28, 30, and 32 are patterned using anisotropic plasma etching. This single etch step minimizes the alignment tolerance and increases memory cell density while reducing processing cost. Another key feature of the invention is to pattern the capacitors only over the planar top surface of the second insulating layer 24, and not over the recesses 3. By not etching over the recesses 3, one avoids the problems associated with metal residue remaining on the sidewalls of the recesses 3 when directional plasma etching is used over non-planar surfaces. This improvement results in higher process yields and improved reliability. After completing the DRAM capacitors, conventional semiconductor processing can be used to complete the integrated circuit chip.

While the invention has been particularly shown and described with reference to the preferred embodiment thereof, it will be understood by those skilled in the art that various changes in form and details may be made without departing from the spirit and scope of the invention.

What is claimed is:

1. A method for making metal-insulator-metal capacitors comprising the steps of:
   providing a substrate having device areas with semiconductor devices;
   forming a planar first insulating layer on said substrate, and depositing an etch-stop layer and a second insulating layer sequentially on said first insulating layer;
   forming contact openings in said second insulating layer, said etch-stop layer, and said first insulating layer to said device areas;
   forming first recesses in said second insulating layer to said etch-stop layer for local interconnections;
   forming electrically conducting lines in said first recesses and forming conducting plugs in said contact openings, both coplanar with top surface of said second insulating layer;
   forming a multitude of second recesses in said second insulating layer to said etch-stop layer around each of said conducting plugs;
   depositing a first metal layer, an interelectrode insulating film, and a second metal layer sequentially over said substrate and conformably in said second recesses;
   patterning said first metal layer, said interelectrode insulating film, and said second metal layer to form capacitors over and contacting said conducting plugs to complete said metal-insulator-metal capacitors.

2. The method of claim 1, wherein said first and second insulating layers are silicon oxide and are deposited to a thickness of between about 500 and 10000 Angstroms.

3. The method of claim 1, wherein said etch-stop layer is silicon nitride and is deposited to a thickness 50 and 2000 Angstroms.

4. The method of claim 1, wherein said electrically conducting lines and conducting plugs are formed by depositing a barrier layer and a tungsten layer and polishing back to said second insulating layer.

5. The method of claim 1, wherein said interelectrode insulating film is a high-k dielectric material composed of tantalum pentoxide, and is deposited to a thickness of between about 20 and 1000 Angstroms.

6. The method of claim 5, wherein said high-k dielectric material is deposited by physical vapor deposition.

7. The method of claim 5, wherein said high-k dielectric material is deposited by chemical vapor deposition.

8. The method of claim 1, wherein said interelectrode insulating film is a ferroelectric material.

9. The method of claim 8, wherein said ferroelectric material is selected from the group consisting of lead-zirconium-titanium oxide (($PbZr_xTi_{1-x})O_3$) and barium-strontium-titanium oxide (($Ba_xSr_{1-x})TiO_3$) and is deposited to a thickness of between about 20 and 1000 Angstroms.

10. The method of claim 1, wherein said first and second metal layers are selected from the group consisting of aluminum-copper alloy, titanium nitride, tantalum, and tantalum nitride, and said first and second metal layers are deposited to a thickness of between about 20 and 1000 Angstroms.

11. A method for making metal-insulator-metal capacitors comprising the steps of:
   providing a substrate having device areas with semiconductor devices;
   forming a planar first insulating layer on said substrate, and depositing an etch-stop layer and a second insulating layer sequentially on said first insulating layer;
   forming contact openings in said second insulating layer, said etch-stop layer, and said first insulating layer to said device areas;
   forming first recesses in said second insulating layer to said etch-stop layer for local interconnections;
   forming electrically conducting lines in said first recesses and forming conducting plugs in said contact openings, said conducting lines and said conducting plugs formed from a barrier layer and a tungsten metal layer both coplanar with top surface of said second insulating layer;
   forming a multitude of second recesses in said second insulating layer to said etch-stop layer around each of said conducting plugs;

depositing a first metal layer, an interelectrode insulating film, and a second metal layer sequentially over said substrate and conformally in said second recesses;

patterning said first metal layer, said interelectrode insulating film, and said second metal layer to form capacitors over and contacting said metal plugs to complete said metal-insulator-metal capacitors.

12. The method of claim 11, wherein said first and second insulating layers are silicon oxide and are deposited to a thickness of between about 500 and 10000 Angstroms.

13. The method of claim 11, wherein said etch-stop layer is silicon nitride and is deposited to a thickness 50 and 2000 Angstroms.

14. The method of claim 11, wherein said barrier layer and said tungsten metal layer are deposited by physical vapor deposition.

15. The method of claim 11, wherein said interelectrode insulating layer is a high-k dielectric material composed of tantalum pentoxide, and is deposited to a thickness of between about 20 and 1000 Angstroms.

16. The method of claim 15, wherein said high-k dielectric material is deposited by physical vapor deposition.

17. The method of claim 15, wherein said high-k dielectric material is deposited by chemical vapor deposition.

18. The method of claim 11, wherein said interelectrode insulating film is a ferroelectric material.

19. The method of claim 18, wherein said ferroelectric material is selected from the group consisting of lead-zirconium-titanium oxide $((PbZr_xTi_{1-x})O_3)$ and barium-strontium-titanium oxide $((Ba_xSr_{1-x})TiO_3)$ and is deposited to a thickness of between about 20 and 1000 Angstroms.

20. The method of claim 11, wherein said first and second metal layers are selected from the group consisting of aluminum-copper alloy, titanium nitride, tantalum, and tantalum nitride, and said first and second metal layers are deposited to a thickness of between about 20 and 1000 Angstroms.

21. A method for making metal-insulator-metal capacitors comprising the steps of:

providing a substrate having device areas with semiconductor devices;

depositing a first insulating layer, an etch-stop layer, and a second insulating layer sequentially on said substrate;

forming contact openings in said second insulating layer, said etch-stop layer, and said first insulating layer to said device areas;

forming first recesses in said second insulating layer to said etch-stop layer for local interconnections;

forming electrically conducting lines in said first recesses and forming conducting plug in said contact openings both coplanar with top surface of said second insulating layer;

forming a multitude of second recesses in said second insulating layer to said etch-stop layer around each of said conducting plugs;

depositing a first metal layer, an interelectrode insulating film dielectric, and a second metal layer sequentially over said substrate and conformally in said second recesses;

patterning said first metal layer, said interelectrode insulating film and said second metal layer to form capacitors over and contacting said metal plugs to complete said metal-insulator-metal capacitors.

22. The method of claim 21, wherein said first and second insulating layers are silicon oxide and are deposited to a thickness of between about 500 and 10000 Angstroms.

23. The method of claim 21, wherein said etch-stop layer is silicon nitride and is deposited to a thickness of between about 50 and 2000 Angstroms.

24. The method of claim 21, wherein said electrically conducting lines and contact plugs are formed by depositing a barrier layer and a tungsten layer and polishing back to said second insulating layer.

25. The method of claim 21, wherein said dielectric is selected from the group consisting of tantalum pentoxide, silicon nitride, titanium oxide, zirconium oxide, and hafnium oxide, and is deposited to a thickness of between about 20 and 1000 Angstroms.

26. The method of claim 21, wherein said high-dielectric constant material is deposited by physical vapor deposition.

27. The method of claim 21, wherein said high-dielectric-constant material is deposited by chemical vapor deposition.

28. The method of claim 21, wherein said first and second metal layers are selected from the group consisting of aluminum-copper alloy, titanium nitride, tantalum, and tantalum nitride, and said first and second metal layers are deposited to a thickness of between about 50 and 1000 Angstroms.

\* \* \* \* \*